United States Patent [19]

Kajiwara et al.

[11] B 4,001,873

[45] Jan. 4, 1977

[54] SEMICONDUCTOR DEVICE

[75] Inventors: Yasuya Kajiwara; Seiichi Nagai; Hiroyasu Hagino, all of Itami, Japan

[73] Assignee: Mitsubishi Denki Kabushiki Kaisha, Japan

[22] Filed: Dec. 23, 1974

[21] Appl. No.: 535,209

[44] Published under the second Trial Voluntary Protest Program on March 16, 1976 as document No. B 535,209.

[30] Foreign Application Priority Data

Dec. 26, 1973 Japan .............................. 49-2156

[52] U.S. Cl. .................................. 357/59; 357/13; 357/52; 357/53; 357/54; 357/58
[51] Int. Cl.² ........................................ H01L 29/04
[58] Field of Search .................. 357/59, 52, 53, 54, 357/58

[56] References Cited

UNITED STATES PATENTS 3,602,782  8/1971  Klein ................................. 357/52

FOREIGN PATENTS OR APPLICATIONS 1,947,067  4/1970  Germany .............................. 357/59

OTHER PUBLICATIONS

Shepard, "Preventing Surface Inversion...", *IBM Tech. Discl. Bull.*, vol. 16, No. 3, Aug. 1973, pp. 702–703.

*Primary Examiner*—William D. Larkins
*Attorney, Agent, or Firm*—Robert E. Burns; Emmanuel J. Lobato; Bruce L. Adams

[57] ABSTRACT

A polycrystalline silicon film is disposed on the face of an N type silicon substrate including a termination of a PN junction to extend slightly beyond the termination of the PN junction from the periphery of the substrate. In the most preferred embodiment, the polycrystalline silicon film terminates short of both the termination of the PN junction and the periphery of the substrate and is enclosed with silicon dioxide, the silicon dioxide being also disposed at the termination of the PN junction and on the adjacent portions of the main substrate face on its both side as well as on the periphery of the main face.

5 Claims, 12 Drawing Figures

SEMICONDUCTOR DEVICE

BACKGROUND OF THE INVENTION

This invention relates to a planar high breakdown voltage semiconductor device.

Planar semiconductor devices are characterized in that the reliability is high and they are suitable for manufacturing in the basis of mass production but they have been previously disadvantageous in that high breakdown voltage elements are difficult to produce. One of the reasons for this is the concentration of an electric field involved on the curved portion of the PN junction. Furthermore in planar semiconductor devices including the silicon substrate, a positive surface charge is present at the interface between the silicon substrate and a film of silicon dioxide disposed thereon and affects the substrate so that the depletion layer therein is difficult to spread on the surface of the silicon substrate resulting in the facilitation of the concentration of the electric field on the surface of the substrate. This is another cause for which planar high breakdown voltage elements are difficult to be produced.

SUMMARY OF THE INVENTION

Accordingly it is an object of the present invention to provide a new and improved planar high breakdown voltage semiconductor device.

It is another object of the present invention to provide a new and improved planar semiconductor device low in surface leakage current and also high in breakdown voltage.

It is still another object of the present invention to provide a new and improved planar high breakdown voltage semiconductor device which is extremely stable by preventing the surrounding atmosphere from affecting the semiconductor device.

It is a further object of the present invention to provide a new and improved planar semiconductor device high in breakdown voltage and stabilized by preventing the occurrence of a leakage current through the channel region.

The present invention accomplishes these objects by the provision of a semiconductor device comprising a wafer of semiconductive material having a main face and including a N type semiconductor region, and a P type semiconductor region disposed in the N type semiconductor region to form a PN junction therebetween, the P type semiconductor region being formed by diffusion to be exposed to the main face of the wafer, the PN junction terminating at the main face of the wafer, and wherein a polycrystalline silicon film is disposed on the main surface of the wafer including the termination of the PN junction.

In a preferred embodiment of the present invention, an electrically insulating film may be disposed on that portion of the main face of the substrate adjacent to the termination of the PN junction and the polycrystalline silicon film may be disposed on at least one area of that portion of the main face of the wafer not overlaid by the electrically insulating film.

Advantageously another electrically insulating film may be disposed on the peripheral portion of the main face of the wafer with the polycrystalline silicon film disposed on the main face of the wafer between both electrically insulating films.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
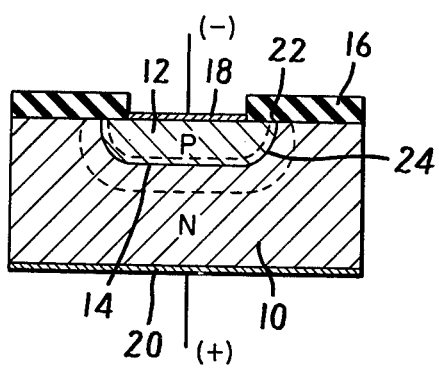
FIG. 1 is a sectional view of a planar semiconductor diode constructed in accordance with the principles of the prior art.

Referring now to FIG. 1 of the drawings, there is illustrated a planar semiconductor diode of conventional construction. The arrangement illustrated comprises an N type silicon substrate 10 including a pair of opposite main faces, a P type semiconductor region 12 disposed in a predetermined portion of one main face, in this case, the upper main face of the N type substrate 10 to form a PN junction 14 therebetween, and a film 16 of electrically insulating material for example, silicon dioxide ($SiO_2$) including a window to which the P type region 12 is exposed except for the peripheral portion thereof. In order to form P type region 12, the insulating film 16 may be first applied to the upper main face of the N type substrate 10 in its entirety and then provided at a predetermined portion with the window. Thereafter a suitable P type impurity is selectively diffused into the N type substrate 10 through the window.

Subsequently, a pair of metallic electrodes 18 and 20 are disposed to ohmic contact with that portion of the one main face exposed to the window and the other main face of the substrate respectively to complete a planar semiconductor diode.

In the planar diode thus formed, the PN junction 14 terminates at 22 on the upper main face of the substrate 10 to intersect that main face. This necessarily leads to the formation of curved portions 24 on the PN junction 14. With a reverse voltage applied across the PN junction 14 as shown in FIG. 1, that is to say, with a voltage at the electrode 18 negative with respect to that at the electrode 20 as shown in FIG. 1, the resulting electric field tends to be concentrated on those curved portions 24 of the PN junction 14. This results in the breakdown occurring with a voltage less than the breakdown voltage for the case of flat PN junctions. The smaller the radius of curvature of the curved junction portion 24 the less the breakdown voltage of the curved PN junction will be. In order to provide high breakdown voltage semiconductor elements, it is required to make that radius of curvature larger by effecting a deep diffusion. In transistors, for example, the deep diffusion is not desirable because both the current gain and the cut-off frequency are decreased.

Further electrically insulating films previously used to coat the junction have been frequently formed of either silicon dioxide ($SiO_2$) produced by thermally oxidizing the associated silicon substrate or silicon nitride ($Si_2N_4$) grown on the surface of the associated silicon substrate from its vapor phase after the surface of the substrate has been chemically processed with any suitable acid such as hydrofluoric acid, nitric acid or the like. It is well known that a positive electrical surface charge exists at the interface between silicon substrate surface and this film of silicon dioxide ($SiO_2$) or silicon nitride ($Si_3N_4$) film previously known. Since this positive electrical surface charge impedes a depletion layer involved from spreading adjacent the silicon surface. The positive surface charge, when excessive in quantity, may cause the particular electric field to be concentrated in the vicinity of the surface of the silicon substrate resulting in the breakdown. In FIG. 1, dotted line designates the spread of the depletion layer.

There have been recently developed novel techniques of producing semiconductor elements through the utilization of polycrystalline silicon wherein polycrystalline silicon is applied to films of electrically insulating material such as silicon dioxide ($SiO_2$) or the like. It has now been discovered that, with polycrystalline silicon applied directly to the surface of silicon substrates, a negative electrical charge is developed at the interface therebetween. This has been confirmed as a result of measurements of the electrical surface charge conducted with samples having an MIS (Metal-Insulator-Semiconductor) structure as shown in FIG. 2 and according to the C-V (capacitance-to-voltage) measurement well known in the art.

Figure 2:
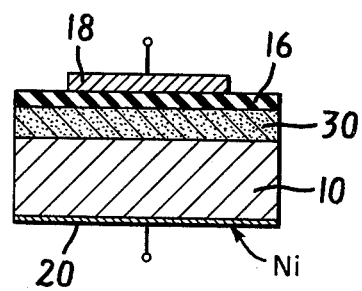
FIG. 2 is a sectional view of an MIS structure illustrating the basic form of the present invention.

The MIS structure as shown in FIG. 2 was produced by preparing a P type silicon substrate 10 having a resistivity of from 10 to 20 ohms-centimeter and depositing in an atmosphere of hydrogen ($H_2$) a polycrystalline silicon film 30 to a thickness of 900A upon a crystallographic plane (100) of the substrate 10 through the pyrolysis of monosilane ($SiH_4$). The film 30 was deposited at a temperature of 850°C. Then monosilane ($SiH_4$) reacted with oxygen ($O_2$) in an atmosphere of nitrogen ($N_2$) to form a silicon dioxide film 16 to a thickness of 1500A upon the polycrystalline silicon film 30 at 650°C. The resulting structure was annealed in an atmosphere of dry oxygen ($O_2$) at 1100°C for from 10 to 15 minutes. Following this, aluminum (Al) was evaporated on the silicon dioxide film 16 to form an electrode 18 while a nickel (Ni) electrode 20 was disposed in ohmic contact with the opposite surface of the substrate 10 by a plating technique. The MIS structure thus formed is shown in FIG. 2 and provides an MIS capacitor.

Figure 3:
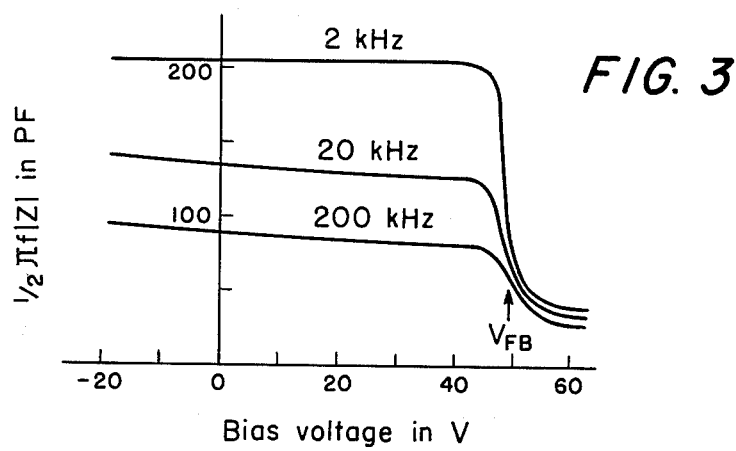
FIG. 3 is a graph illustrating the relationship between a capacitance and an applied voltage for the arrangement shown in FIG. 2.

A capacitance bridge well known in the art was used to measure the capacitance of samples having the MIS structure as shown in FIG. 2 at different frequencies with the bias voltage thereacross varied. The results of the measurements are illustrated in FIG. 3 wherein $\frac{1}{2}\pi f/|Z|$ in picofarads is plotted as the ordinate against the bias voltage in volts as the abscissa with the parameter being a measuring frequency $f$. The $|Z|$ designates the absolute value of measured impedance of the sample. In FIG. 3 it is seen that a flat band voltage $V_{FB}$ has a positive value. The term "flat band voltage" provides a measure of a curvature of the energy band on the surface of a semiconductive body, and tends to be proportional to a density of a surface charge. The flat band voltage $V_{FB}$ is shown in FIG. 3 as being of about plus 50 volts. At that magnitude of the voltage, the surface charge had a density of $6 \times 10^{12}$ per square centimeter. The presence of the positive flat band voltage offers a proof that a negative surface charge is induced at the interface between the silicon substrate and the polycrystalline silicon film which has not at all been known heretofore. Further it has been found that this negative surface charge is developed only in the case where silicon substrates are contacted directly by the polycrystalline silicon film. In other words, the negative surface charge is not observed with silicon substrates coated by the film of silicon dioxide even though the film is very thin; as on the order of 50A.

Thus what is important is the pre-treatment of silicon substrates prior to the formation of the polycrystalline silicon film thereon. That is, it is required to remove any undesirable coating such as $SiO_2$ coating from silicon substrates by etching with dilute hydrofluoric acid, rinsing with water and drying them after which the polycrystalline silicon film should be immediately deposited on the clean surface thereof.

Figure 4:
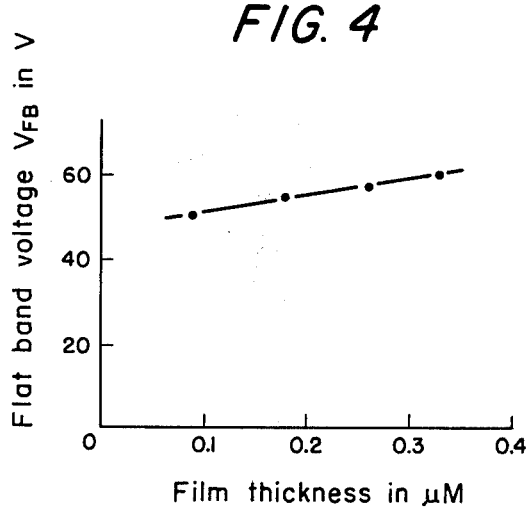
FIG. 4 is a graph illustrating the relationship between a flat band voltage and a thickness of the polycrystalline silicon film shown in FIG. 2.
Figure 5:
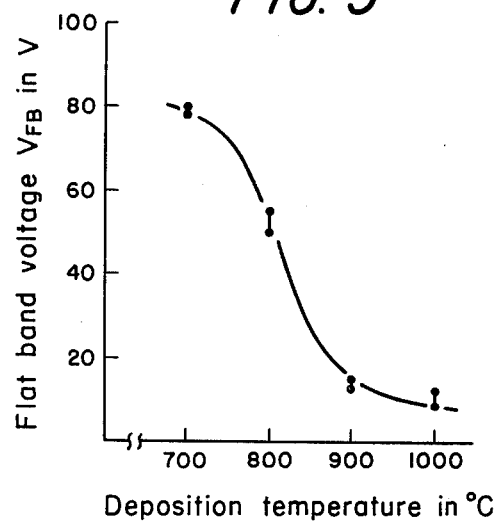
FIG. 5 is a graph illustrating the relationship between a flat band voltage and a temperature at which a polycrystalline silicon film is deposited on the silicon substrate shown in FIG. 2.

FIG. 4 shows the relationship between a flat band voltage $V_{FB}$ in volts (in ordinate) and a thickness in $\mu$m (in abscissa) of a polycrystalline silicon film formed or deposited at a temperature of 850°C while FIG. 5 shows the relationship between a flat band voltage $V_{FB}$ in volts (in ordinate) and a formation or depostion temperature in centigrades (in abscissa) of a polycrystalline silicon film. It has been found that the flat band voltage $V_{FB}$ is less dependent upon the thickness of the polycrystalline silicon film as shown in FIG. 4 and is much more dependent upon the deposition temperature of the polycrystalline silicon film as shown in FIG. 5. It is believed that an increase in the deposition temperature of the polycrystalline silicon film will cause the tendency for silicon to be grown in the form of a single crystal resembling the epitaxial growth. Thereby a surface charge at the interface of the silicon substrate and the polycrystalline silicon film will be decreased. For this reason, the polycrystalline silicon film is preferably formed at a temperature ranging from 700°C to 1000°C.

Although the mechanism by which a negative surface charge is induced at the interface between the silicon substrates and the polycrystalline silicon film is not yet understood and is a subject that should be solved in the future, the present invention utilizes the phenomenon of the negative surface charge as above described to provide planar high breakdown voltage semiconductor elements as will be subsequently described.

Figure 6:
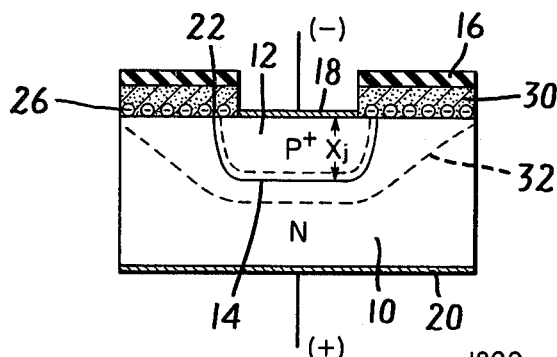
FIG. 6 is a sectional view of a planar semiconductor diode construction in accordance with the principles of the present invention.

In FIG. 6 wherein like reference numerals designate the components identical or similar to those shown in FIG. 1, there is illustrated one embodiment of the present invention applied to planar semiconductor diodes having the simplest structure. The arrangement illustrated comprises a substrate 10 of N type silicon having a resistivity of from 30 to 40 ohms-centimeter and a $P^+$ type semiconductor region 12 disposed in the substrate 10 in the manner as above described in conjunction with FIG. 1 through the selective diffusion of boron as an impurity. As in the arrangement of FIG. 1, a PN junction 14 is formed between the $P^+$ type region 12 and the N type substrate 10 to terminate at 22 on the main face of the substrate 10. Thus the PN junction 14 has the end or termination intersecting the main face of the substrate 10. After having removed an oxide film (not shown) formed upon the substrate 10 in the diffusion step, a polycrystalline silicon film 30 is directly deposited upon that main face of the substrate having the $P^+$ type region 12 exposed thereto as by a chemical vapor deposition technique well known in the art. In the example illustrated the polycrystalline silicon film 30 has been formed into a thickness of about 1.2 $\mu$m at a temperature of 850°C.

Subsequently a film 16 of any suitable, electrically insulating material such as silicon dioxide is disposed upon the polycrystalline silicon film 24 as by thermal oxidation or chemical vapor deposition technique or the like.

Then those portions of the films 16 and 30 underlaid by the $P^+$ type region 12 except for that portion thereof adjacent to the junction termination 22 are suitably removed to form a window to expose a surface of the $P^+$ type region 12 somewhat smaller in area than the latter as in the arrangement of FIG. 1. A pair of metallic electrodes 18 and 20 are disposed in ohmic contact with the exposed surface of the $P^+$ type region 12 within the window and with that main face of the substrate 10 remote from the silicon film 30 respectively, as by evaporation technique well known in the art, to complete a planar semiconductor diode.

In FIG. 6 a negative surface charge 26 is also shown by the minus signs in circle as being induced at the interface of the silicon substrate 10 and the polycrystalline silicon film 30 and dotted line 32 designates a boundary to which a depletion layer involved is spread in response to a voltage applied across the electrodes 18 and 20 so as to have the reverse polarity relative to the P—N junction 14.

In the arrangement of FIG. 6, the negative surface charge is induced at the interface of the silicon substrate 10 and the polycrystalline silicon film 30 and is effective to spread the depletion layer on the surface of the silicon substrate 10 as above described. Namely, the depletion layer is spread much more at the surface of the silicon substrate thereby to alleviate the concentration of an electric field involved on the curved portion of the PN junction resulting in an increase in the breakdown voltage.

The structure as shown in FIG. 6 is also effective for rendering the breakdown voltage of semiconductor planar diodes high though they would include the shallow PN junction therein.

Figure 7:
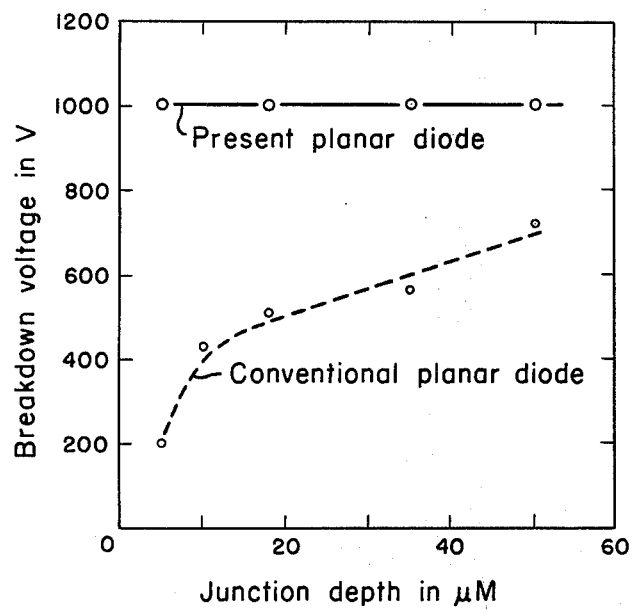
FIG. 7 is a graph illustrating the comparison of a planar semiconductor diode with a polycrystalline silicon layer constructed in accordance with principles of the present invention with a conventional planar semiconductor diode in terms of the breakdown voltage-to-junction depth characteristic.

FIG. 7 is a graph illustrating a junction depth $Xj$ (see FIG. 6) in $\mu$m plotted as the ordinate against a breakdown voltage in volts as the abscissa for a planar semiconductor diodes constructed as shown in FIG. 6 and a conventional planar semiconductor diode. As shown by the dotted line in FIG. 7, the conventional planar diode may have a breakdown voltage on the order of about 600 volts which sharply decreases with a decrease in the junction depth $Xj$ whereas the present planar diode with the polycrystalline silicon film has a breakdown voltage as high as the order of 1000 volts and remains substantially constant with an increase in the junction depth as shown by the solid line in FIG. 7.

However, it has been found that a surface leakage current increases in the arrangement of FIG. 6 although it has the characteristic features as above described. The leakage current through planar semiconductor diodes has a temperture characteristic such as that shown in FIG. 8 wherein the ordinate represents a leakage current in microamperes and the abscissa represents a reciprocal temperature in units of $10^{-3}$ °$K^{-1}$. From FIG. 8 it is seen that a semiconductor planar diode having a structure such as shown in FIG. 6 is higher about 1 order of magnitude in leakage current than a conventional one having a structure such as shown in FIG. 1. The leakage current includes an ohmic current flowing through the polycrystalline silicon film or the silicon diode film as the case may be, a generation current and a channel current developed adjacent the P-N junction involved etc. This difference in leakage current is believed to result from a difference in resistivity between the polycrystalline silicon film and the silicon dioxide film. That is, usual silicon dioxide has a resistivity ranging from $10^{10}$ to $10^{12}$ ohms-centimeter while polycrystalline silicon has a low resistivity of about $10^6$ ohms-centimeter. Accordingly, a current can more easily flow through the polycrystalline silicon film.

Figure 9:
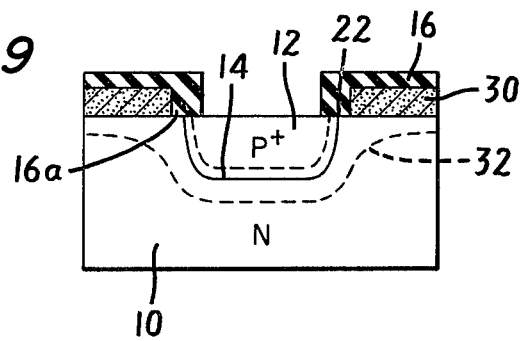
FIGS. 9 and 10 are sectional views of different modifications of the arrangement shown in FIG. 6.

In order to decrease the surface leakage current, the arrangement of FIG. 6 can be modified as shown in FIG. 9 wherein like reference numerals designate the components identical or similar to those illustrated in FIG. 6. As shown in FIG. 9, the polycrystalline silicon film 30 extends on the main face of the substrate 10 from the periphery thereof and terminates short of the end 22 of the PN junction 14. In other words, the end 22 of the PN junction 14 and the adjacent portions of the $P^+$ type region 12 and the N type substrate 10 are contacted by a film 16a of any suitable electrically insulating material such as silicon dioxide which may be a downwardly directed extension of the insulating film 16 underlaid by the silicon film 30. The insulating film 16a serves to decrease both a surface leakage current and a generation current tending to flow therethrough.

Figure 10:
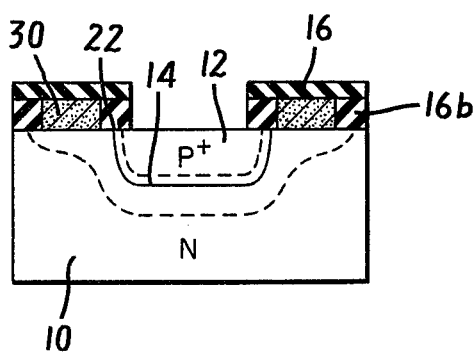

In the arrangement of FIG. 9, a negative surface charge may be induced in an excessive quantity at the interface between the polycrystalline silicon film 30 and the silicon substrate 10 to excessively spread the depletion layer at the surface of the substrate 10. This results in a flow of channel current. In order to avoid this objection, the silicon substrate 10 can be provided on the peripheral edge portion of that main face overlaid by the silicon film 30 with a film 16b of any suitable electrically insulating material, for example, silicon dioxide as shown in FIG. 10 wherein like reference numerals designate the components identical or similar to those illustrated in FIG. 9. The film 16b is connected to the insulating film 16.

Figure 8:
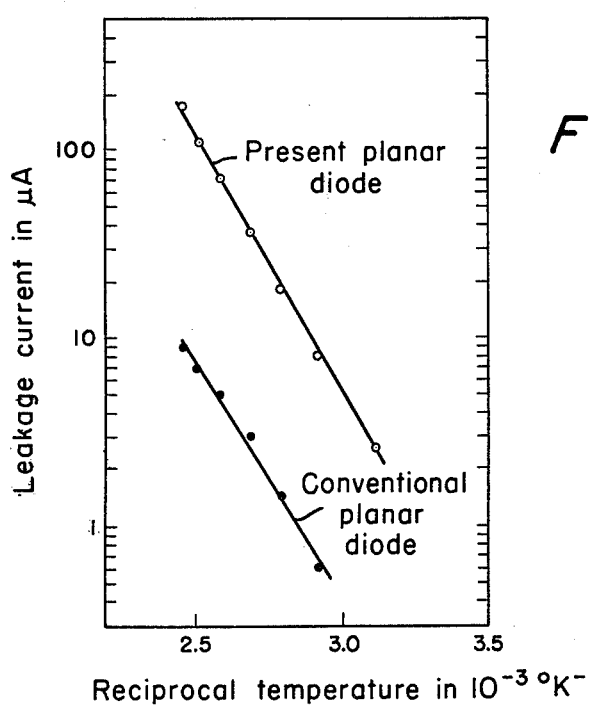
FIG. 8 is a graph similar to FIG. 7 but illustrating the leakage current-to-temperature characteristic.

It has been experimentally indicated that a surface leakage current flowing through the arrangement of FIG. 10 is decreased to a magnitude as low as shown in FIG. 8 for a conventional planar diode. Thus FIG. 10 illustrates the most preferred embodiment of the present invention.

The arrangement of FIG. 10 can easily be manufactured by a combinaton of photolithographic C.V.D., etching techniques etc. well known in the art.

As an example, the arrangement of FIG. 10 may be constructed as follows: Preliminarily supposing that on a portion of the N type silicon substrate 10 in which the PN junction 14 is formed through the selective diffusion of an impurity, a polycrystalline silicon film 30 including no impurity or a small amount of an impurity is selectively applied to a thickness of from 0.2 to 1.5 μm on one of the main faces of the N type silicon substrate except for the peripheral edge portion thereof and so as not to intersect the termination 22 of the P-N junction 12 subsequently formed in this substrate. It has been found that, with the thickness of the polycrystalline silicon film less than 0.2 μm, the main face of the substrate may include portions to which such a film does not adhere. On the other hand, if the thickness of the polycrystalline silicon film exceeds 1.5 μm then the succeeding processes become difficult to be effected. Therefore the thickness of the polycrystalline silicon film should range from 0.2 to 1.5 μm. Further the high purity of polycrystalline silicon should be used for the reasons that such silicon is effective for preventing a decrease in a negative surface charge developed at the interface between the silicon substrate and the polycrystalline silicon film while lowering a flow of leakage current through the polycrystalline silicon film.

Then disposed on the polycrystalline silicon film and the exposed surface portion of the silicon substrate not overlaid by the silicon film is a film of electrically insulating material such as silicon dioxide serving to function as a mask during the subsequent diffusion of an impurity. This results in the formation of the insulating film 16 including the insulating film 16b to coat both the exposed surface portion of the main substrate face and the polycrystalline silicon film. Following this, a window is formed in a predetermined portion of the insulating film so that that portion of the insulating film surrounding the window covers the termination 22 of the P-N junction 14 that will be formed by the subsequent diffusion of an impurity. Thereafter any suitable impurity is selectively diffused into that portion of the substrate exposed to the window to form a P$^+$ type diffusion region and also a P-N junction between the substrate and the P type diffusion region. In this way, the P$^+$ type semiconductor region 12, the P-N junction 14 and the insulating film 16a covering the junction termination 22 have been formed as shown in FIG. 10.

As an alternative process, a conventional selective diffusion technique may be first used to form a P$^+$ type semiconductor region in an N type silicon substrate and also therebetween a PN junction having its end exposed to the adjacent main face of the substrate. Then an electrically insulating film is disposed on the entire main face of the substrate including the P$^+$ type region in the well known manner after which the insulating film is removed by using a mask except for the peripheral edge portion and that portion adjacent to the termination of the P-N junction at the substrate. A polycrystalline silicon film is disposed on the exposed portion of the main face of the substrate caused from this selective removal of the insulating film. Then an electrically insulating film such as 16, 16a and 16b is disposed on the peripheral edge portion of the substrate and those portions of the N type substrate and P$^+$ type region adjacent at the junction termination as well as on the polycrystalline silicon film resulting in a structure similar to that shown in FIG. 10. The insulating film may be an oxide film and has a positive surface charge developed thereon. The films 16, 16a and 16b as shown in FIG. 10 form the insulating film thus produced.

In the arrangement of FIG. 10 it is not necessarily required to coat the polycrystalline silicon film 30 with the insulating film 16 but the presence of that insulating film 16 is effective for preventing the surface of the polycrystalline silicon film 30 from being contaminated with moisture, dirt etc. while preventing undesirable impurities such as metal atoms from doping the polycrystalline silicon film. Thus the resulting arrangement can be maintained stable during long periods of service.

Figure 11:
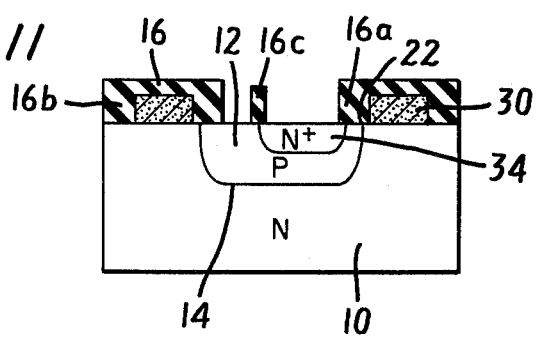
FIG. 11 is a sectional view of a transistor constructed in accordance with the principles of the present invention.
Figure 12:
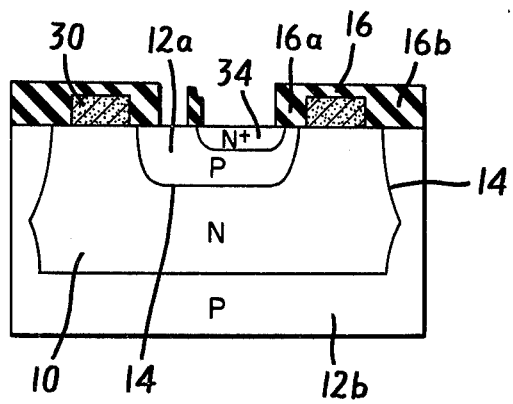
FIG. 12 is a sectional view of a thyristor constructed in accordance with the principles of the present invention.

FIGS. 11 and 12 wherein like reference numerals designate the components identical or similar to those shown in FIG. 10 illustrate different forms of the present invention applied to a transistor and a thyristor respectively, each having a planar structure. In FIG. 11 an N type substrate 10 forms a collector layer, and has disposed therein a P type diffusion region 12 forming a base layer with a PN junction 14 therebetween having a termination 22 contacted by the insulating film 16a. Further an N$^+$ type diffusion region 34 is disposed in the P$^+$ type region 12 to form an emitter layer and a PN junction formed therebetween engages the insulating film 16a and another insulating film 16c.

The arrangement of FIG. 12 is different from that shown in FIG. 11 only in that in FIG. 12, the N type substrate 10 is surrounded by a P type emitter layer 12b and a PN junction 13 formed therebetween contacts the insulating film 16b. The N$^+$ type region 34, the P type region 12a and the N type substrate 10 form an N type emitter, a P type base and an N$^+$ type base layer respectively.

In the arrangements shown in FIGS. 11 and 12, the polycrystalline silicon film 30 is disposed on the surface of the silicon substrate ensuring that they are high in breakdown voltage.

While the present invention has been illustrated and described in conjunction with a few preferred embodiments thereof it is to be understood that various changes and modifications may be resorted to without departing from the spirit and scope of the present invention. For example, the present invention is equally applicable to integrated circuit configurations.

What we claim is:

1. In a semiconductor device of the type comprised of a semiconductor substrate having a first conductivity type and having a major surface; and a semiconductor region disposed within said substrate and having a second conductivity type opposite that of said first conductivity type, said semiconductor region having a surface portion terminating at and exposed at the major surface of said substrate and said semiconductor region jointly forming with said semiconductor substrate a PN junction defining the boundary therebetween, said PN junction having a surface portion terminating at the major surface of said substrate and defining the boundary between the surface portion of said semiconductor region of said second conductivity type and the major surface of said semiconductor substrate of said first conductivity type; the improvement which comprises: a substantially undoped polycrystalline silicon film disposed directly on the major surface of said semiconductor substrate and extending laterally thereon to overlie the major surface of said semiconductor substrate and to overlie the surface portion of said PN junction.

2. In a semiconductor device of the type comprised of a semiconductor substrate having a first conductivity type and having a major surface; and a semiconductor region disposed within said substrate and having a second conductivity type opposite that of said first conductivity type, said semiconductor region having a surface portion terminating at and exposed at the major surface of said substrate and said semiconductor region jointly forming with said semiconductor substrate a PN junction defining the boundary therebetween, said PN junction having a surface portion terminating at the major surface of said substrate and defining the boundary between the surface portion of said semiconductor region of said second conductivity type and the major surface of said semiconductor substrate of said first conductivity type; the improvement which comprises: a substantially undoped polycrystalline silicon film disposed directly on the major surface of said semiconductor substrate about the surface portion of said PN junction and extending laterally on the major surface away from the surface portion of said PN junction to overlie the major surface of said semiconductor substrate and so as to not overlie the surface portion of said PN junction; and an electrically insulating film disposed directly on and overlying the surface portion of said PN junction.

3. In a semiconductor device according to claim 2, wherein said substantially undoped polycrystalline silicon film does not overlie a peripheral edge portion of the major surface of said substrate, and further comprising another electrically insulating film disposed directly on and overlying the peripheral edge portion of the major surface free of said silicon film.

4. In a semiconductor device according to claim 2, wherein said electrically insulating film extends onto and overlies said substantially undoped polycrystalline silicon film.

5. In a semiconductor device according to claim 2, wherein said electrically insulating film is comprised of silicon dioxide.

* * * * *